United States Patent [19]

Pratt

[11] Patent Number: 5,608,353
[45] Date of Patent: Mar. 4, 1997

[54] HBT POWER AMPLIFIER

[75] Inventor: William J. Pratt, Greensboro, N.C.

[73] Assignee: RF Micro Devices, Inc., Greensboro, N.C.

[21] Appl. No.: 412,667

[22] Filed: Mar. 29, 1995

[51] Int. Cl.$^6$ .................................................. H03F 3/68
[52] U.S. Cl. ................................................ 330/295; 330/296
[58] Field of Search ...................................... 330/289, 295, 330/296, 307

[56] References Cited

U.S. PATENT DOCUMENTS

| | | | |
|---|---|---|---|
| 3,577,092 | 5/1971 | Kubicz | 330/124 |
| 3,969,752 | 7/1976 | Martin et al. | 357/51 |
| 3,986,058 | 10/1976 | Hongu et al. | 330/296 X |
| 4,124,823 | 11/1978 | Sechi | 330/295 X |
| 4,631,495 | 12/1986 | Mueller et al. | 330/295 X |
| 4,728,902 | 3/1988 | Gleason et al. | 330/296 X |
| 5,066,926 | 11/1991 | Ramachandran et al. | 330/311 |
| 5,109,262 | 4/1992 | Kadota et al. | 357/34 |
| 5,214,394 | 5/1993 | Wong | 330/286 |
| 5,233,310 | 8/1993 | Inoue | 330/307 X |
| 5,274,342 | 12/1993 | Wen et al. | 330/295 |
| 5,352,911 | 10/1994 | Grossman | 257/198 |
| 5,422,522 | 6/1995 | Rotay | 330/296 X |

*Primary Examiner*—James B. Mullins
*Attorney, Agent, or Firm*—Rhodes, Coats & Bennett, L.L.P.

[57] ABSTRACT

An improved heterojunction bipolar transistor power amplifier circuit providing an efficient and linear amplifier comprising: a first heterojunction bipolar transistor (HBT) having a base emitter voltage; a power supply; a power supply resistor connected to the power supply causing DC current to flow through the first HBT which develops a resultant voltage equal to the base emitter voltage of the first HBT; at least two manifold base resistors; at least two output HBTs, each of which receive the resultant voltage through its corresponding manifold base resistor; a RF signal input; at least two segmented capacitors, each coupled in parallel to receive the RF signal input and to the input of each corresponding output HBT; the segmented capacitors having a common input connected to the RF signal input and having individual outputs that are DC isolated from each other and which are connected to each output HBT; a RF output signal obtained from the parallel connection of the output HBTs; and provided that each HBT is connected to ground.

3 Claims, 6 Drawing Sheets

SIMPLIFIED SCHEMATIC OF PA

HBT POWER AMPLIFIER

BACKGROUND OF THE INVENTION

1. Field of the Invention

The present invention generally relates to monolithic radio frequency (RF) microwave integrated circuits, and more specifically to a multiple device structure used for RF power amplifications using a heterojunction bipolar transistor (HBT).

2. Description of the Related Art

Heterojunction bipolar transistors enable more efficient RF power amplification than other semiconductor devices in integrated circuit form. Extremely high power added efficiency can be obtained because of the high power density and high breakdown of the HBT devices. For high power designs, a multitude of devices are used in some form of parallel structure in order to distribute the power over a sufficient area such that excessive heating is not present to degrade the performance or reliability of the devices.

During normal operation, the current is equally distributed through the many HBTs and excessive heat and other problems do not result. However, if the HBTs are even slightly mismatched, one HBT will operate at a higher temperature than the others and draw a larger amount of current. Since the combined current of all devices is much more than enough to cause destruction of the hot HBT, the possibility exists for what is called in the art, "thermal runaway." Thermal runaway results when one device fails, causing a chain reaction failure of other components. Unfortunately, small differences in devices or placement can cause an imbalance of heating between the individual devices. Any bipolar device which is connected in parallel with other similar devices and which is hotter than its neighbors will tend to draw more current, thus heating itself even more. The heating compounds itself and the result is a thermal runaway phenomenon which will destroy the device and the integrated circuit (IC) itself.

Two prior art circuit techniques which attempt to avoid this problem are the use of an emitter ballast resistor (FIG. 2), and the use of cascode device cells (FIG. 3). In FIG. 2, the ballast resistors degenerate the gain of the device such that increased collector current tends to increase emitter voltage and thereby decrease the emitter-base bias voltage, hence reducing current. A thermally stable circuit can be achieved by making the emitter ballast resistors sufficiently large to prevent this degeneration.

Another method is to use cascode devices as shown in FIG. 3. In this circuit, most of the voltage is impressed on the upper (common base) transistor in each pair. Therefore, most of the heat is generated in this device instead of the common emitter amplifier, which can now operate at a much lower temperature and thereby minimizing the possibility of thermal runaway.

The prior art designs, however, contain limits on efficiency. In the above circuits, other devices are used to achieve thermal stability which are placed in series with the output device. It is desired that as much power taken from the DC power supply as possible is transformed into RF power at the output of the circuit. Any power consumed in the circuit itself, therefore, is wasted and results in degraded overall efficiency. In FIG. 2, the DC and AC collector current that drives the output must pass through the emitter ballast resistors. Therefore, significant power is dissipated in those resistors. This translates to wasted power, and hence reduced efficiency of the amplifier. Since gallium arsenide generally is not a good heat conductor, the emitter ballast resistors have to be quite large to thermally stabilize the circuit and the efficiency loss is commensurably large.

In a cascode circuit (FIG. 3), another transistor is placed in series with the output. The effect is the same as above, i.e., the extra transistor consumes power hence reducing efficiency. The efficiency loss is quite severe because the common emitter's collector must be maintained at a fairly high voltage (one volt or more) in order for that transistor to stay out of saturation that would reduce gain and linearity. Therefore, the cascode arrangement is inferior to the emitter ballast method from a thermal stability point of view.

Thus there is a need in the art for an efficient and linear amplifier which can be built in HBT integrated circuit technology.

SUMMARY OF THE INVENTION

The present invention generally relates to an improved heterojunction bipolar transistor power amplifier circuit providing an efficient and linear amplifier comprising: a first heterojunction bipolar transistor (HBT) having a base emitter voltage; a power supply; a power supply resistor connected to the power supply causing DC current to flow through the first HBT which develops a resultant voltage equal to the base emitter voltage of the first HBT; at least two manifold base resistors; at least two output HBTs, each of which receive the resultant voltage through its corresponding manifold base resistor; a RF signal input; at least two segmented capacitors, each coupled in parallel to receive the RF signal input and to the input of each corresponding output HBT; the segmented capacitors having a common input connected to the RF signal input and having individual outputs that are DC isolated from each other and which are connected to each output HBT; a RF output signal obtained from the parallel connection of the output HBTs; and provided that each HBT is connected to ground.

These and other aspects of the present invention as disclosed herein will become apparent to those skilled in the art after a reading of the following description of the preferred embodiments when considered with the drawings.

DESCRIPTION OF THE PREFERRED EMBODIMENTS

The drawings are for the purpose of describing a preferred embodiment of the invention and are not intended to limit the present invention.

As used herein, efficiency is generally defined to be Power Added Efficiency—Total RF Power OUT divided by total RF plus DC power IN. Symbols used in the figures are as follows:

Any element with a label which has the prefix "R" or has the resistor symbol -⌒- is a resistor.

Any element with a label which has the prefix "C" is a capacitor.

Any element with a label which has the prefix "L" is an inductor.

Any element with a label which has the prefix "Q" is an HBT (Heterojunction Bipolar Transistor).

The label "RFIN" refers to the input signal port of the amplifier.

The label "RFOUT" refers to the output signal port of the amplifier.

The label "VCC" refers to the power supply input connection.

The "Ground" symbol ≡ refers to both Signal and Power Supply common connection.

The "Battery" symbol ⊤ refers to a source of DC voltage.

Figure 1:
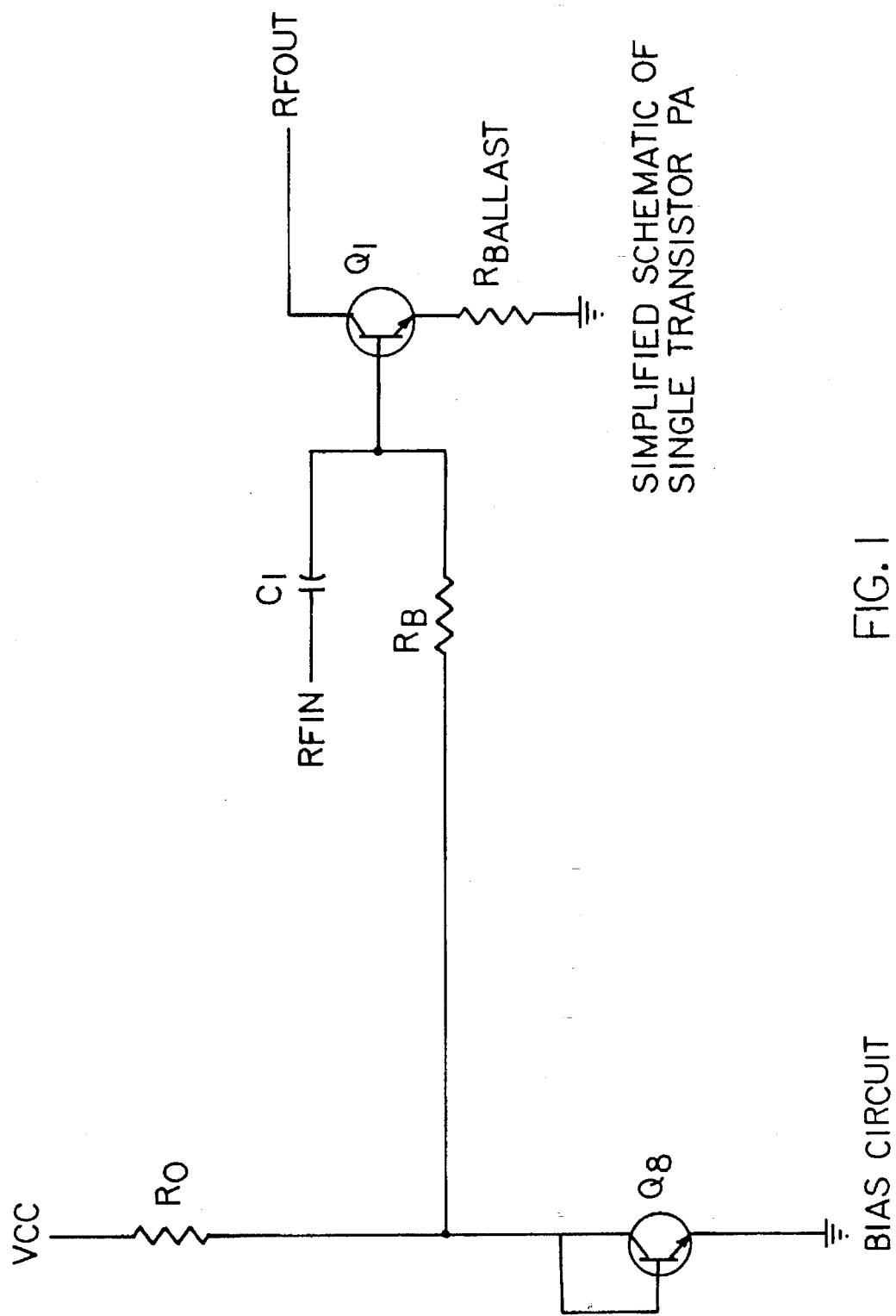
FIG. 1 is a prior art electrical schematic of a conventional single transistor amplifier showing a commonly used base biasing scheme.

In FIG. 1, Q1 is the power amplifier transistor. It has an emitter ballast resistor (RBALLAST) connected between the emitter of the transistor and ground. The emitter current flows through this resistor and as the current increases, the voltage at the emitter of Q1 becomes more positive which, in turn, decreases the voltage between the base (which has a fixed DC voltage) and emitter of the device causing less current to flow. Hence, the ballast resistor causes negative feedback and provides thermal stability of the device.

The bias network consists of Q8, and RB. The resistor R0 connected to VCC causes DC current to flow through Q8, which develops a voltage equal to the VBE of the transistor. This voltage is fed to the base of Q1 through RB, causing similar flow of current through Q1.

Capacitor C1 connects the RF input port of the amplifier to the base of Q1, coupling RF (but not DC) voltage to the base of Q1.

The output of the amplifier is taken from the collector of Q1.

Figure 2:
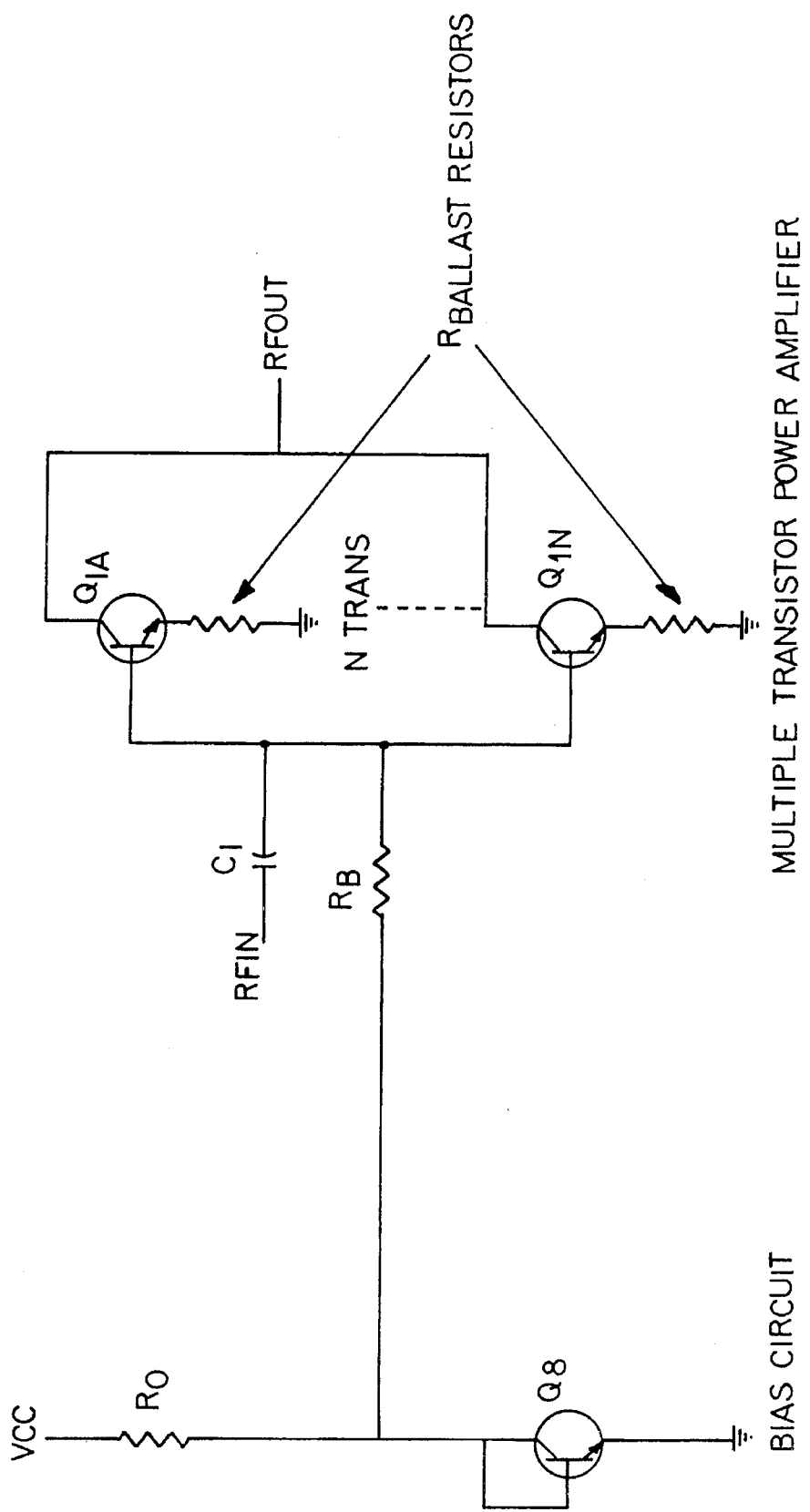
FIG. 2 is a prior art electrical schematic of a multiple device design that uses emitter ballast resistors to achieve thermal stability.

In FIG. 2, the circuit is the equivalent of the amplifier shown in FIG. 1, except that an array of individually smaller transistors (Q1A . . . Q1N) are used in place of the larger single transistor of FIG. 1. Each individual transistor has its own ballast resistor (RBALLAST) connected between the emitter of each transistor and ground such that each individual transistor is thermally stabilized. The base bias voltage generated by Q8 is coupled to all transistors in parallel through resistor RB. The output is taken from the parallel connection of all collectors.

Figure 3:
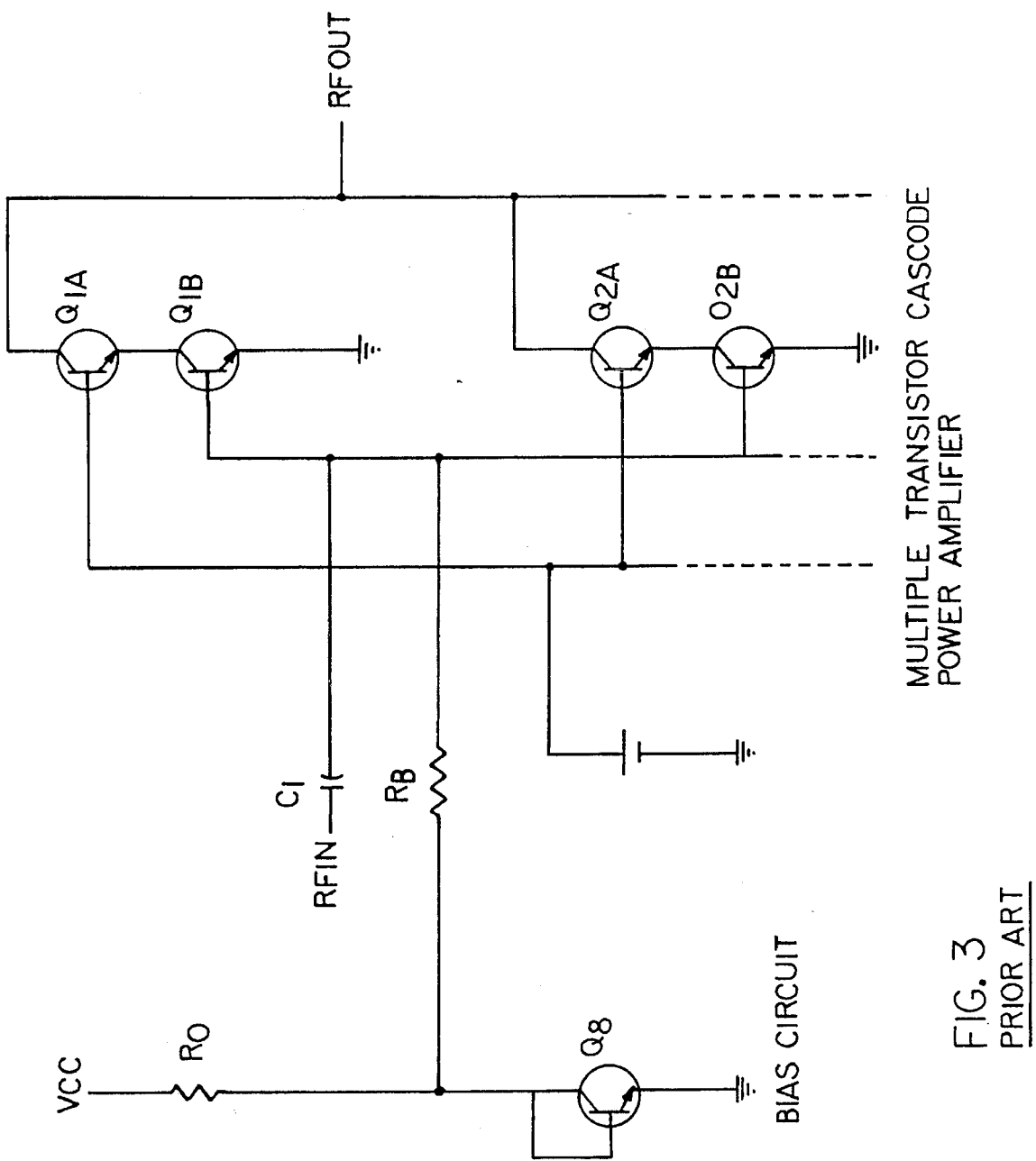
FIG. 3 is a prior art electrical schematic of a multiple device cascode amplifier.

In FIG. 3, a "Cascode" arrangement for the output stage of the amplifier is shown. Here, each parallel output device is actually two transistors (e.g., Q1A, Q1B and Q2A, Q2B). The lower transistor (B) has RF drive (coupled through C1 from the RFIN port) and DC bias (through RB) applied to the base as in FIG. 2. Base bias voltage is developed as described for FIG. 1. The emitters of the lower transistors are grounded, however, with no ballast resistor. The upper transistor (A) has its emitter connected to the collector of the lower transistor (B). The output is taken from the parallel connections of the upper transistors. DC base voltage to the upper transistor is supplied from the battery. This circuit is thermally stable because the collector voltage of the lower transistor is at a very low value (battery voltage minus the VBE, drop of the upper transistor) rather than the full VCC voltage for the common emitter amplifier. Therefore, even though the current may be high, power consumption (and thus heating) in the lower transistor (which sets the current level) is low because of the low collector voltage (Power= Voltage×Current). The upper transistor (A) becomes quite hot since the full power is impressed, but that transistor does not control current, so no thermal runaway is present.

Figure 4:
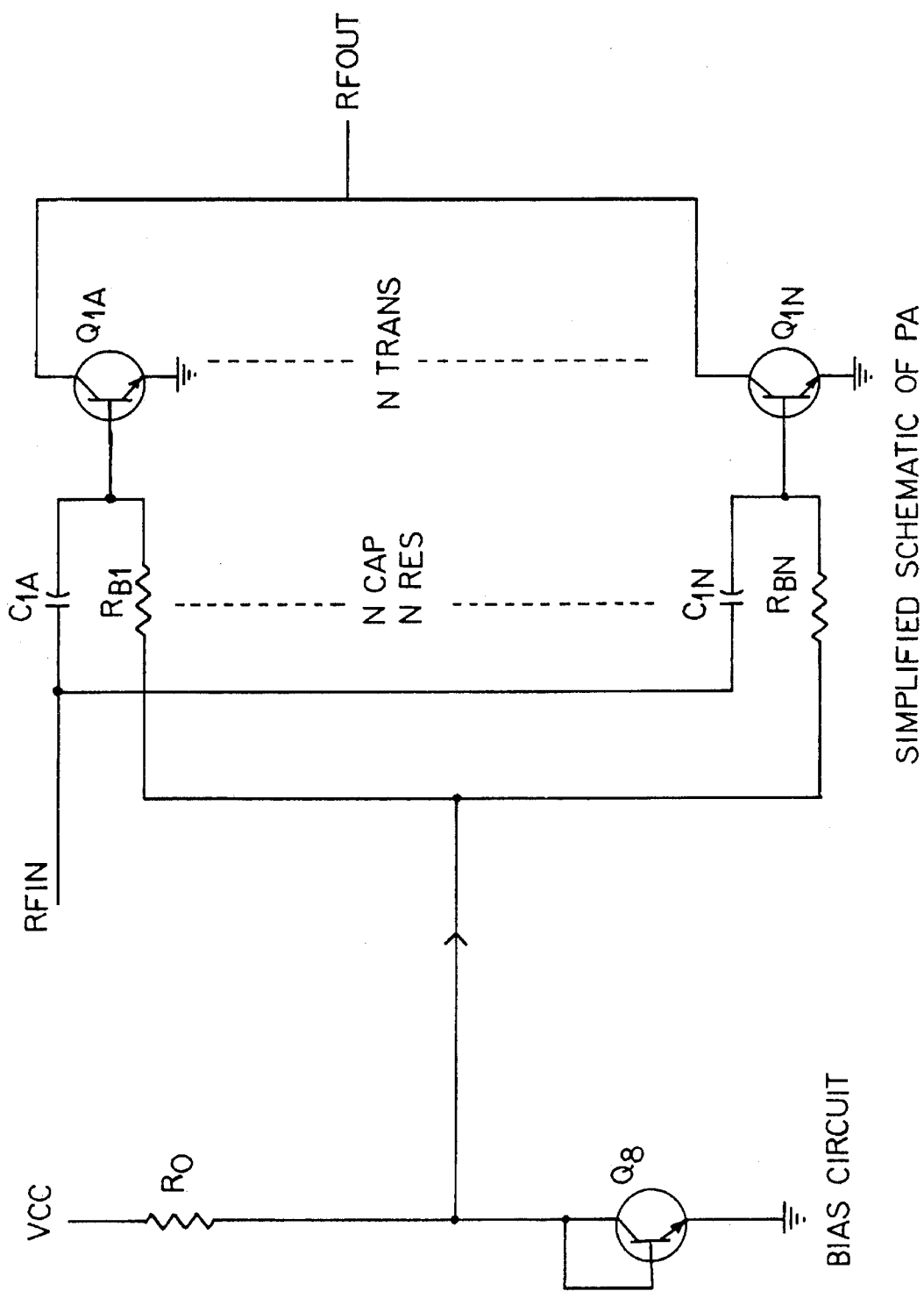
FIG. 4 is an electrical schematic of a multiple device amplifier disclosing an embodiment of the present invention.

FIG. 4 shows a preferred embodiment of the new circuit. The bias network consists of Q8, and manifold base resistors —once for each transistor (RBI . . . RBN). The resistor connected to VCC causes DC current to flow through Q8, which develops a voltage equal to the VBE of the transistor. This voltage is fed to the base of each output transistor (Q1A . . . Q1N) through individual base resistors (RBI . . . RBN), causing a similar flow of current through each Q1 transistor.

The RF signal from the input port (RFIN) is coupled to each transistor through the segmented capacitor C1. Capacitor C1 has a common input connected to RFIN and individual outputs which are DC isolated from each other and which are connected to each output transistor base. The capacitor is schematically represented as an array of capacitors (C1A . . . C1N).

The output transistors have no ballast resistors, but instead, are connected directly to ground. The output is taken from the parallel connection of the collectors of Q1A through Q1N.

This configuration is thermally stable because increased heating in the output transistors causes the BETA (Collector Current divided by Base current) to be reduced, hence requiring more base current to maintain a given collector current. Thus, as the transistors become hotter, base current increases, causing a larger voltage drop across each base resistor (RB1 . . . RBN), which, in turn, reduces VBE (base to emitter voltage). This reduction in VBE reduces collector current, providing negative feedback, hence providing thermal stability.

Figure 5:
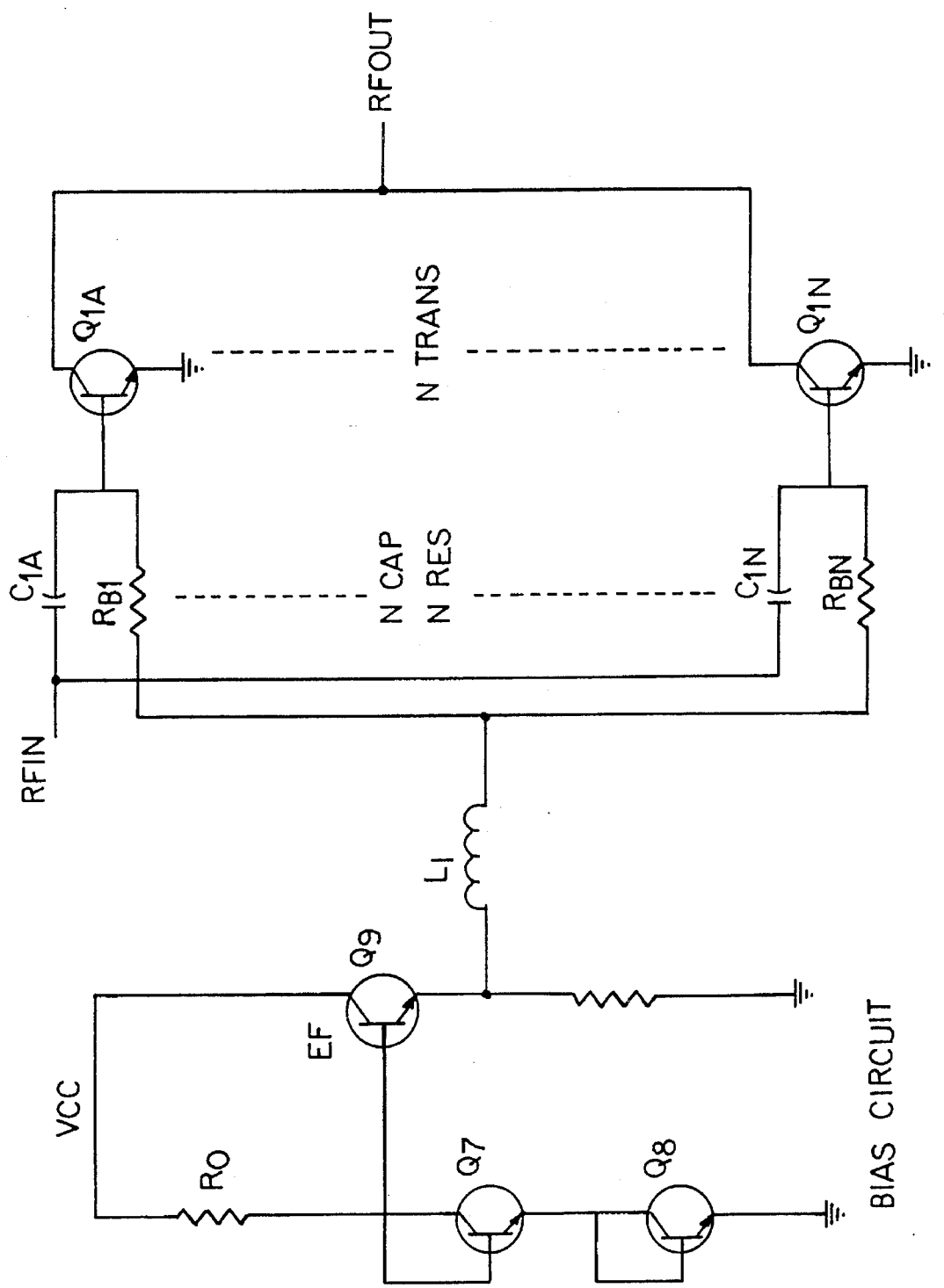
FIG. 5 is an electrical schematic of a multiple device amplifier optimized for linearity that uses emitter follower bias circuit.

FIG. 5 shows a preferred embodiment of the new circuit that enhances amplification linearity. The operation of the output stage consisting of C1A through C1N, RB1 through RBN, and transistors Q1A through Q1N is the same as that of FIG. 4.

The bias circuit is different in that it provides a low impedance, linear bias supply for the output stage which enhances amplification linearity of the circuit. The bias voltage is derived from two diode connected transistors (Q7 and Q8). The resistor connected to VCC provides current to these devices which are connected in series. The voltage at the collector of Q7 is two times VBE. This voltage is impressed on the base of Q9, the emitter follower transistor. The collector of Q9 is connected to VCC. The emitter voltage is the base voltage minus VBE. Therefore, since the transistors are identical, the emitter voltage of Q9 is equal to VBE (2×VBE−VBE=VBE). This is the desired bias voltage for the output transistors Q1A through Q1N. An emitter resistor is placed in between the emitter of Q9 and ground in order to force a static collector current through Q9 even when the current demand from the output transistors is low. This is done to maintain a low impedance at the emitter of Q9.

Inductor L1 is optional. If not present, the emitter of Q9 is connected to each RB resistor to provide base bias for the output transistors. Linearity is improved because the bias supply at Q9 emitter is nearly an ideal voltage source. Addition of inductor L1 improves linearity still further because it reduces the RF signal power which is coupled back to the bias supply source. This means that the collector current of Q9 is only DC without RF current, making that transistor more linear.

Figure 6:
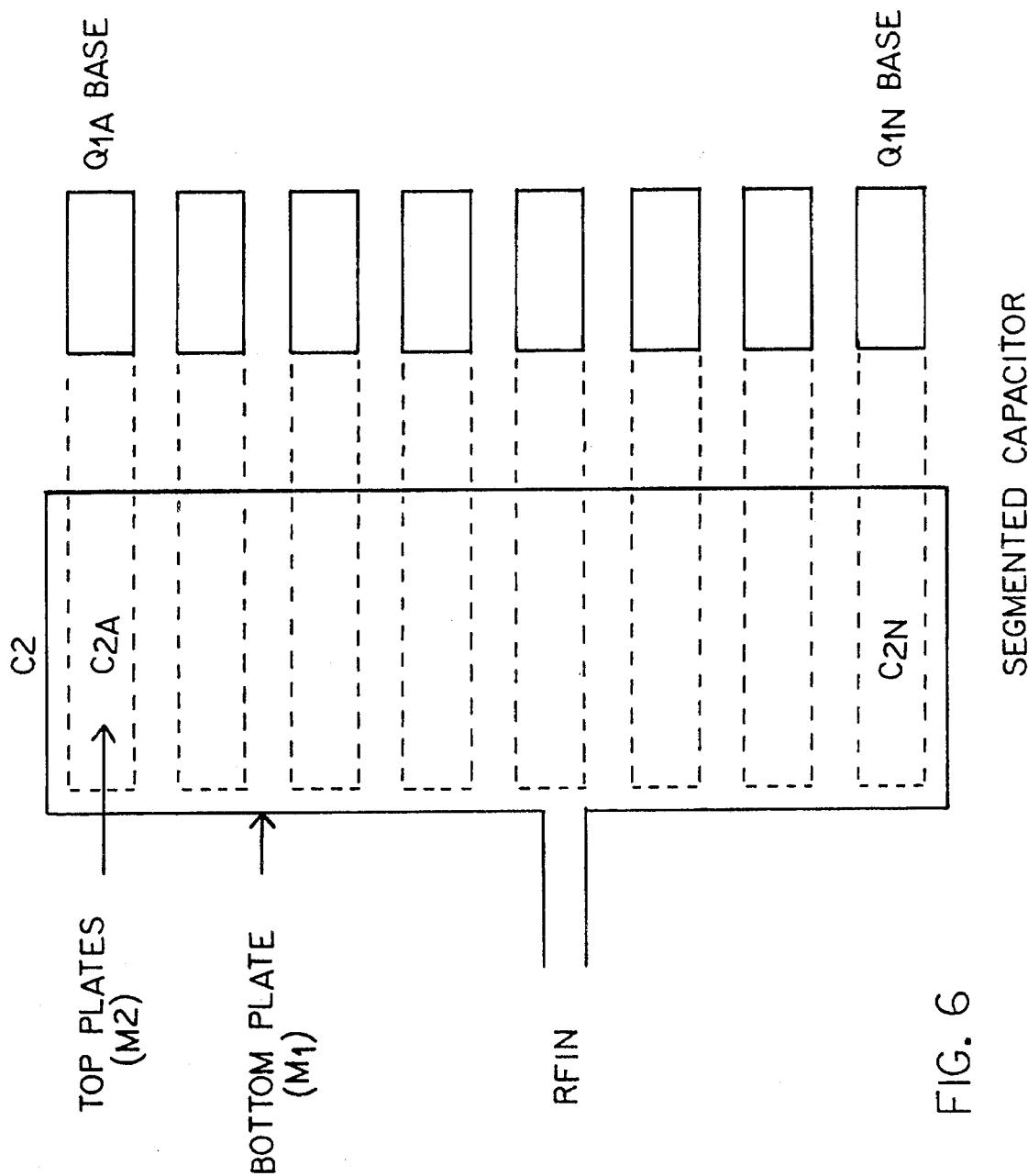
FIG. 6 is a drawing of a segmented capacitor.

FIG. 6 shows a pictorial representation of the segmented capacitor. In an integrated circuit, connections are made between various elements (resistors, capacitors, transistors, etc.) using metal traces on the surface of the chip. Two layers of metal interconnect are commonly used and one layer (top metal—M2) may cross over the other layer (bottom layer—M1). These layers are isolated by a thin layer of insulator material so that they do not form an electrical short circuit to one another. In the figure, the top metal layer is shown as dotted lines while the bottom layer is shown as solid lines.

In the segmented capacitor, the RFIN port is connected to the bottom metal layer. This metal feature is large and is spread over the entire area of the capacitor. Individual smaller top metal features are placed over (on top of) the bottom layer as shown with the dotted lines in the figure. Since the insulation between layers is thin, a two plate capacitor is formed wherever the top layer overlaps the bottom layer. The capacitance is determined by the area of the overlap. The top metal features are extended beyond the capacitor area (right side of drawing), so that each top metal feature may be used to connect to an individual transistor base. Hence the base of each transistor is AC connected to the RFIN port through a capacitor, while they remain isolated for DC voltages.

Many physical layouts for the segmented capacitor are possible and need not be rectangular as shown. Also, the bottom and top layers may be interchanged. The feature of this device is the fact that it has one common input node and manifold output nodes formed by segmenting one of the metal layers of the device.

In accordance with this invention, no elements, either resistors or other transistors, are placed in series with other output devices. All DC input power from the power supply is transformed into RF power at the output with the exception of the unavoidable loss in the HBT output devices, themselves. This translates to the maximum possible efficiency.

Thermal stabilization is optimized in the improved circuit disclosed herein. The collector current of each HBT device is proportional to the base emitter voltage (VBE), which is the voltage difference between the base of the device and the emitter of the device. This voltage, VBE, for a given collector current goes down as temperature rises. Therefore, thermal instability results if the base emitter voltage (VBE) remains constant. If temperature goes up, collector current goes up, thereby increasing the power and heating in the device. This, in turn, causes the VBE to be reduced for a given current, and since VBE is constant, increased current and heating continue unabated until the device is destroyed.

Thermal stability is achieved in this design by taking advantage of a consistent characteristic of HBT transistors; namely, that DC Beta (Collector current divided by Base current) decreases as junction temperature goes up. Therefore, as a device heats up, its base current goes up accordingly, assuming a constant collector current. Conversely, if base current remains constant, collector current is reduced. Placing a resistance in series with the base of each devices achieves thermal stability because (assuming a constant output power and collector current), as the device becomes warmer, base current must increase to counter the reduced Beta of the device. In the circuit implementation, the value of the base resistor is set to offset the decreasing VBE to yield the desired collector current. That is, the increasing base current multiplied by the base resistor value (IR drop) gives an increased voltage drop which compensates for the VBE shift attendant to higher temperature, thus achieving thermal stability.

Since each of the many devices used to make up a complete power amplifier are almost thermally independent in a Gallium Arsenide process (which is used for HBT), each device must have its own thermal stabilization. That is, for each device, a base resistor is needed. Driving the many bases through the base resistors would reduce the gain of the amplifier significantly since much of the RF input power from the driver would be dissipated in the base resistors. Since it is necessary to drive all devices in parallel, this invention includes in a preferred embodiment the use of a segmented capacitor which is shown in FIG. 6 and which allows each base to be isolated for thermal stability purposes, but all connected together at the RF frequency. This circuit element is similar in construction to a standard Metal-Insulator-Metal (MIM) capacitor except that the top (or bottom) metal is segmented to provide DC isolation of each HBT base connection. That is, the capacitor provides a common AC (RF signal) connection between all device bases, but keeps them isolated at DC.

An HBT power amplifier designed in accordance with this invention has achieved better efficiency performance than previous art designs that have been reported. In one test, utilizing a preferred embodiment, a chip was fabricated using a Gallium Arsenide HBT process. The final power amplifier (FPA) employed an array of twenty-six 2 μm×10 μm quad emitters, dual collector transistors along with 26 base resistors (each 400 Ohms), and a segmented capacitor with a total value of 9.36 pF—each segment is 0.36 pF. The part was housed in a 16 pin plastic SOIC package, known to those skilled in the art. The packaged part was mounted on a test circuit board (printed circuit board) which contained external components for the power supply feed to the output circuit, and a matching network to match the device impedance to 50 Ohms for test purposes. The power loss in these external networks was found to be 5% of the total output power. More specifically, the test results are shown in the table below:

| TEST RESULTS | |
|---|---|
| PARAMETER | RESULTS |
| Measured Power Output | 1.26 Watts (+31 dBm) (including external component loss) |
| Device Power Output | 1.323 Watts (taking out external component loss) |
| Current Consumption (Total) | .41 Amps |
| Overall Efficiency | 64% |
| Overall Device Efficiency | 67% |
| FPA Only Current | .365 Amps |
| FPA Efficiency | 75.5% |

The test conditions were as follows: VCC=4.8V DC; Input Power=+5 dBm; Frequency =840 MHz.

As is set forth above, this invention takes advantage of the characteristics and ability of the HBT in a way that allows the most efficient and most linear amplifier which can be built in HBT IC technology.

The above description of the preferred embodiments thus detail many ways in which the present invention can provide its intended purposes. While several preferred embodiments are described in detail hereinabove, it is apparent that various changes might be made without departing from the scope of the invention, which is set forth in the accompanying claims.

I claim:

1. An improved heterojunction bipolar transistor power amplifier circuit comprising: a first heterojunction bipolar transistor (HBT) having a base emitter voltage; a power supply; a power supply resistor connected to the power supply causing DC current to flow through the first HBT which develops a resultant voltage equal to the base emitter voltage of the first HBT; at least two manifold base resistors; at least two output HBTs, each of which receive the resultant voltage through its corresponding manifold base resistor; a RF signal input; at least two capacitors formed from a segmented capacitor, each coupled in parallel to receive the RF signal input and to the input of each corresponding output HBT; the capacitors having a common input connected to the RF signal input and having individual outputs that are DC isolated from each other and which are connected to each output HBT; a RF output signal obtained from the parallel connection of the output HBTs; and provided that each HBT is connected to ground.

2. The improved heterojunction bipolar transistor power amplifier circuit of claim 1, wherein said power supply is a linear bias supply that enhances linearity of the circuit.

3. The improved heterojunction bipolar transistor power amplifier circuit of claim 1, whereby the segmented capacitor comprises a top plate; a bottom plate connected to, but electrically isolated from, the top plate; a two plate capacitor formed wherever the top plate overlaps the bottom plate with a capacitance determined by the area of the overlap; a RF input connected to the bottom plate; the top plate having areas used to AC connect to the output HBTs in such a manner to allow the two plate capacitor to remain isolated from DC voltages.

* * * * *